(12) United States Patent
Takakusagi

(10) Patent No.: US 9,305,950 B2
(45) Date of Patent: Apr. 5, 2016

(54) SOLID-STATE IMAGING APPARATUS AND IMAGING SYSTEM

(71) Applicant: CANON KABUSHIKI KAISHA, Tokyo (JP)

(72) Inventor: Hiroshi Takakusagi, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 76 days.

(21) Appl. No.: 14/210,908

(22) Filed: Mar. 14, 2014

(65) Prior Publication Data

US 2014/0285694 A1    Sep. 25, 2014

(30) Foreign Application Priority Data

Mar. 21, 2013   (JP) ................................. 2013-059061

(51) Int. Cl.

| | |
|---|---|
| *H04N 5/335* | (2011.01) |
| *H01L 27/146* | (2006.01) |
| *H04N 5/232* | (2006.01) |
| *H04N 5/369* | (2011.01) |
| *H04N 9/07* | (2006.01) |

(52) U.S. Cl.
CPC ...... *H01L 27/14621* (2013.01); *H01L 27/1463* (2013.01); *H01L 27/14623* (2013.01); *H04N 5/23212* (2013.01); *H04N 5/3696* (2013.01); *H04N 9/07* (2013.01)

(58) Field of Classification Search
CPC ........... H01L 27/1421; H01L 27/1463; H04N 5/23212; H04N 5/3696
See application file for complete search history.

(56) References Cited

U.S. PATENT DOCUMENTS

| | | | | |
|---|---|---|---|---|
| 7,816,755 | B2 * | 10/2010 | Yamazaki | ......... H01L 27/14603 |
| | | | | 257/292 |
| 9,086,577 | B2 * | 7/2015 | Takakusagi | ............ G02B 27/40 |
| 2013/0107086 | A1 | 5/2013 | Nagano | |
| 2014/0285701 | A1 * | 9/2014 | Takakusagi | ............ G02B 27/40 |
| | | | | 348/336 |

FOREIGN PATENT DOCUMENTS

| | | |
|---|---|---|
| JP | 2007-158597 A | 6/2007 |
| JP | 2008-015215 A | 1/2008 |
| JP | 2008-028105 A | 2/2008 |
| JP | 2008-270298 A | 11/2008 |
| JP | 2009-105358 A | 5/2009 |
| JP | 2012-004264 A | 1/2012 |
| JP | 2012-037777 A | 2/2012 |

* cited by examiner

*Primary Examiner* — Gary C Vieaux
(74) *Attorney, Agent, or Firm* — Fitzpatrick, Cella, Harper & Scinto

(57) ABSTRACT

A solid-state imaging apparatus, comprising a plurality of pixels arrayed on a substrate, and element isolation regions formed between the plurality of pixels on the substrate, wherein the plurality of pixels include a first pixel including a first color filter for passing light having a first wavelength, a second pixel including a second color filter for passing light having a second wavelength longer than the first wavelength, and a pixel for focus detection including a light-shielding pattern arranged on the photoelectric conversion portion to limit light entering the photoelectric conversion portion, and among the element isolation regions, a first region between the pixel for focus detection and the first pixel has a potential barrier against a signal charge, which is lower than that of a second region between the first pixel and the second pixel.

8 Claims, 5 Drawing Sheets

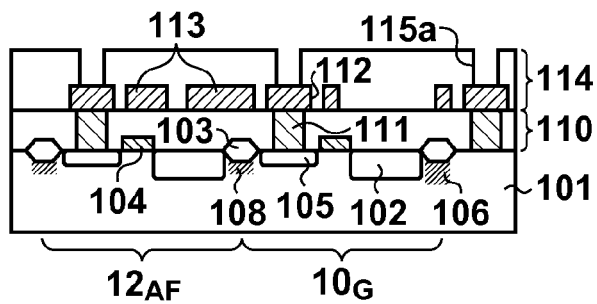
F I G. 4A
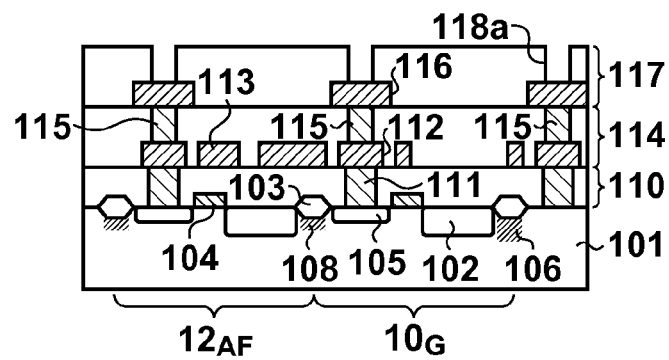
F I G. 4B
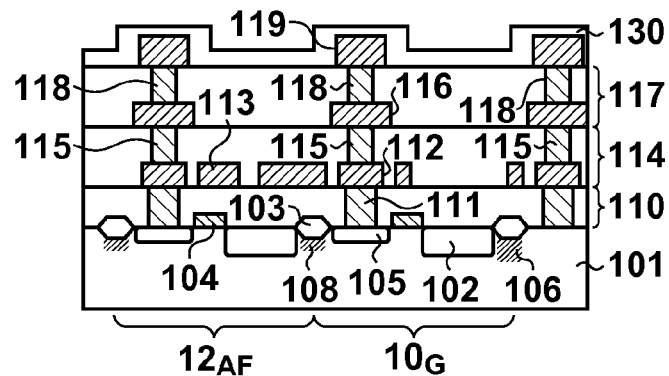
F I G. 4C
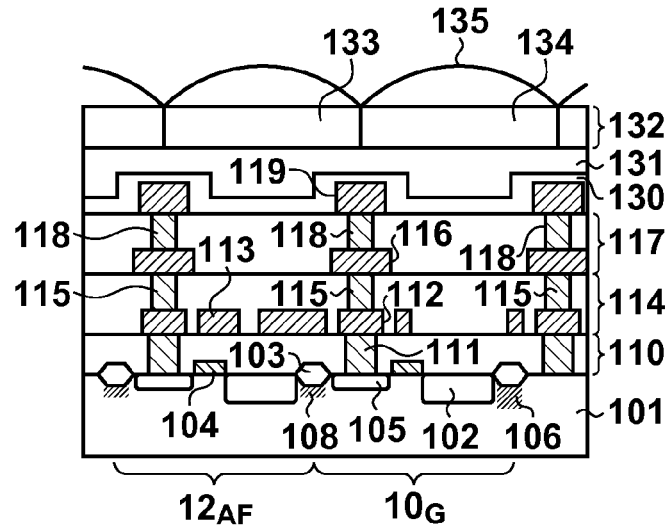
F I G. 4D

SOLID-STATE IMAGING APPARATUS AND IMAGING SYSTEM

BACKGROUND OF THE INVENTION

1. Field of the Invention

The present invention relates to a solid-state imaging apparatus and an imaging system.

2. Description of the Related Art

An imaging system such as a digital camera can be downsized by using a solid-state imaging apparatus in which pixels for imaging each having a photoelectric conversion portion and pixels for focus detection each having a photoelectric conversion portion are arranged on a single substrate. As each pixel for imaging, it is possible to use, for example, a pixel (a red, green, or blue pixel) obtained by forming a red, green, or blue color filter on the photoelectric conversion portion. These pixels for imaging can be arranged in accordance with, for example, a Bayer array, and the pixels for focus detection can be arranged in some of positions where, for example, the red pixels are to be arranged. Focus detection is performed by, for example, a phase difference detection method. The pixel for focus detection adopts a structure for performing pupil division, in which no color filter is normally formed in many cases.

An element isolation region can be formed between the pixels of the substrate so as to prevent crosstalk occurring when a signal charge generated in each pixel moves between adjacent pixels. As the number of pixels increases (as the size of each pixel decreases), however, it has become necessary to increase the photoelectric conversion efficiency of the photoelectric conversion portion and decrease the area of the element isolation region at the same time. This makes it difficult to suppress crosstalk.

In the structure of the above-described pixel array, the amount of crosstalk between, for example, the red pixel and green pixel is different from that of crosstalk between the pixel for focus detection and the green pixel. This is so because a light-shielding pattern for pupil division is formed in the pixel for focus detection, and thus the amount of light entering the photoelectric conversion portion of the pixel for focus detection is small, as compared with the pixel for imaging. Since the amount of electric charge moving to an adjacent pixel depends on the amount of generated electric charge, for example, the amount of electric charge moving from the pixel for focus detection to an adjacent green pixel becomes smaller than that of electric charge moving from the red pixel to an adjacent green pixel. Thus, in the arrangement in which the pixels for imaging and the pixels for focus detection are arranged on a single substrate, the amount of crosstalk in the region where the pixel for focus detection is arranged differs from that in other regions, and this may impair the quality of an image to be obtained.

SUMMARY OF THE INVENTION

The present invention provides a technique advantageous in improving the quality of an image to be obtained by a solid-state imaging apparatus.

One of the aspects of the present invention provides a solid-state imaging apparatus, comprising a plurality of pixels arrayed on a substrate and each including a photoelectric conversion portion, and element isolation regions formed between the plurality of pixels on the substrate, wherein the plurality of pixels include a first pixel including a first color filter for passing light having a first wavelength, a second pixel including a second color filter for passing light having a second wavelength longer than the first wavelength, and a pixel for focus detection including a light-shielding pattern arranged on the photoelectric conversion portion to limit light entering the photoelectric conversion portion, and among the element isolation regions, a first region between the pixel for focus detection and the first pixel has a potential barrier against a signal charge, which is lower than that of a second region between the first pixel and the second pixel.

Further features of the present invention will become apparent from the following description of exemplary embodiments with reference to the attached drawings.

BRIEF DESCRIPTION OF THE DRAWINGS

FIGS. 4A to 4D are views for explaining an example of a method of manufacturing the solid-state imaging apparatus according to the first embodiment;

DESCRIPTION OF THE EMBODIMENTS

Figure 1A:
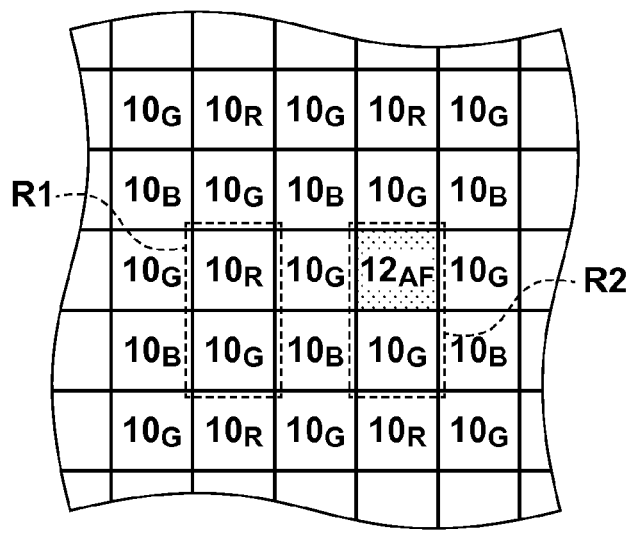
FIGS. 1A and 1B are views for explaining a reference example of the arrangement of a solid-state imaging apparatus.

Before the description of each embodiment of the present invention, a solid-state imaging apparatus $I_D$ will be explained as a reference example with reference to FIGS. 1A and 1B. The solid-state imaging apparatus $I_D$ includes pixels 10 for imaging (including red pixels $10_R$, green pixels $10_G$, and blue pixels $10_B$) and pixels (AF pixels) $12_{AF}$ for focus detection arrayed on a single substrate 101 (a semiconductor substrate). As shown in FIG. 1A, the red pixels $10_R$, green pixels $10_G$, and blue pixels $10_B$ are arrayed in accordance with a Bayer array, and the AF pixels $12_{AF}$ are arranged in some of positions where the red pixels $10_R$ are to be arranged. In the solid-state imaging apparatus $I_D$, a region R1 is a region where the red pixel $10_R$ and green pixel $10_G$ are adjacent to each other, and a region R2 is a region where the AF pixel $12_{AF}$ and green pixel $10_G$ are adjacent to each other. Note that in each embodiment, the pixel for focus detection is a pixel whose output signal is mainly used in focus detection, and the pixel for imaging is a pixel whose output signal is mainly used in imaging. It is also possible to use a signal from the pixel for focus detection in imaging, and a signal from the pixel for imaging in focus detection.

Figure 1B:
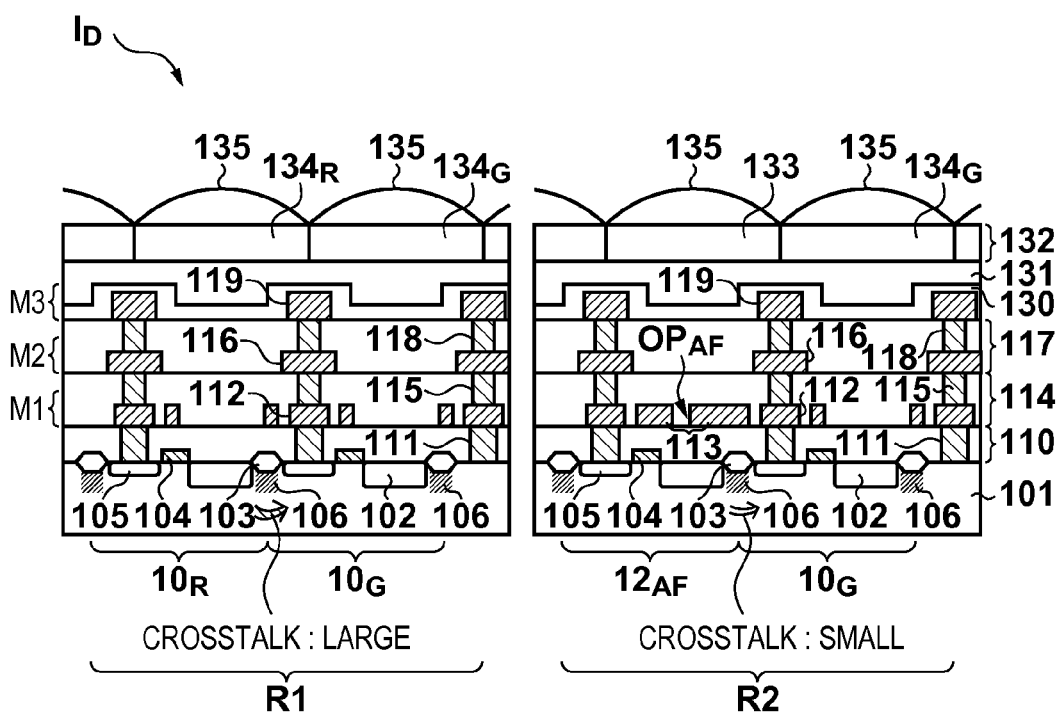

FIG. 1B exemplarily shows the sectional structures of the regions R1 and R2 of the solid-state imaging apparatus $I_D$. In each of the pixel 10 for imaging and the AF pixel $12_{AF}$, an interlayer insulation film 110 or the like, a contact plug 111 or the like, a wiring pattern 112 or the like, a passivation film 130, and a microlens 135 are formed on the substrate 101. In the pixel 10 for imaging, a color filter 134 ($134_R$, $134_G$, or $134_B$) having a corresponding color can also be arranged in a filter layer 132 between a photoelectric conversion portion 102 and the microlens 135. In the green pixel $10_G$ (a first pixel), for example, the color filter $134_G$ (a first color filter) for passing green light (light having a first wavelength) is arranged. In the red pixel $10_R$ (a second pixel), for example, the color filter $134_8$ (a second color filter) for passing red light (light having a second wavelength) is arranged. In the blue pixel $10_B$ (a third pixel), for example, the color filter $134_E$ (a third color filter) for passing blue light (light having a third wavelength) is arranged. Note that the wiring pattern 112 or the like forms wiring layers M1 to M3.

A signal sufficient to perform focus detection need only be obtained from the AF pixel $12_{AF}$, and the color filter 134 need not be formed in the AF pixel $12_{AF}$. In this embodiment, a structure in which a light-transmitting colorless member 133 is formed in the AF pixel $12_{AF}$ is disclosed as an example. However, the present invention is not limited to this structure. For example, the AF pixel $12_{AF}$ may also take a structure in which neither the color filter 134 nor the member 133 is arranged.

Each of the pixel 10 for imaging and the AF pixel $12_{AF}$ need only take a known circuit arrangement, and can include, in addition to the photoelectric conversion portion 102, a plurality of transistors such as a transfer transistor and source follower transistor for reading out an electrical signal from the photoelectric conversion portion 102. When a control signal to be applied to the gate of the transfer transistor is activated, the transfer transistor transfers a signal charge (to be referred to as an electric charge hereinafter) generated and accumulated in the photoelectric conversion portion 102 to the gate of the source follower transistor. Consequently, the potential of the gate changes, and the amount of electric current flowing through the source follower transistor can change in accordance with this potential change. Note that FIG. 1B specifically shows a gate electrode 104 of the transfer transistor, and a floating diffusion 105 (an FD 105) as one diffusion region of the transfer transistor. The FD 105 is electrically connected to the gate of the above-described source follower transistor.

Also, each pixel 10 for imaging (or the AF pixel $12_{AF}$) can further include, for example, a selection transistor as one of the plurality of transistors. When a control signal to be applied to the gate of the selection transistor is activated, the selection transistor can output a signal corresponding to the electric current amount of the source follower transistor. In addition, the pixel 10 for imaging (or the AF pixel $12_{AF}$) can further include, for example, a reset transistor as one of the plurality of transistors. When a control signal to be applied to the gate of the reset transistor is activated, the reset transistor can reset the potential of the gate of the source follower transistor. Note that the individual pixels can have the same circuit arrangement as shown in FIG. 1B.

In the arrangement as described above, signals can be read out from the pixels 10 for imaging (or the AF pixels $12_{AF}$). Image data can be formed by inputting the signals read out from the pixels 10 for imaging to a processing unit (not shown) for performing signal processing such as image processing. Also, focus detection is performed by, for example, a phase difference detection method. The AF pixel $12_{AF}$ can take a structure in which a light-shielding pattern 113 having an opening $OP_{AF}$ is formed in one of the wiring layers M1 to M3 (in this arrangement, the wiring layer M1), so as to perform pupil division. The opening $OP_{AF}$ is formed to be eccentric from the center of the photoelectric conversion portion 102, and the light-shielding pattern 113 limits light entering the photoelectric conversion portion 102. In this arrangement, a signal read out from each AF pixel $12_{AF}$ is input to, for example, a focus detection unit (not shown) for performing focus detection, and the lens position is adjusted in accordance with the result of focus detection.

On the substrate 101, an isolation portion 103 made of an insulator is formed between the photoelectric conversion portions of the pixels. On the substrate 101, an element isolation region 106 can be formed between the pixels so as to prevent crosstalk that occurs due to the movement, between adjacent pixels, of an electric charge generated in the photoelectric conversion portion of each pixel. The isolation portion 103 between the pixels and the element isolation region 106 between the pixels can be regarded as an isolation portion 103 and element isolation region 106 between adjacent photoelectric conversion portions. Furthermore, the element isolation region 106 can be so arranged as to surround the outer periphery of the photoelectric conversion portion 102 of each pixel. As the number of pixels increases (as the size of pixels decreases), one or both of the isolation portion 103 and element isolation region 106 are also downsized, and this makes it difficult to suppress crosstalk. "Crosstalk" is the mixing of a signal charge to an adjacent pixel, and the amount of crosstalk means a signal charge amount to be mixed in an adjacent pixel. In this arrangement, the crosstalk amount between the red pixel $10_R$ and green pixel $10_G$ can be different from that between the AF pixel $12_{AF}$ and green pixel $10_G$. This is so because a light-shielding pattern for adopting a structure for performing pupil division is formed in the pixel for focus detection and thus the amount of light entering the photoelectric conversion portion of the pixel for focus detection is small, as compared with the pixel for imaging. Since the amount of electric charge moving to an adjacent pixel depends on the amount of generated electric charge, the amount of electric charge moving to the green pixel $10_G$ adjacent to the AF pixel $12_{AF}$ is smaller than that of electric charge moving to the green pixel $10_G$ adjacent to the red pixel $10_R$, as indicated by arrows in FIG. 1B. Consequently, the amounts of crosstalk in the regions R1 and R2 are largely different, so the quality of an image to be obtained by the solid-state imaging apparatus $I_D$ can deteriorate. Note that the present invention will be explained by taking a case in which a signal charge is an electron as an example.

First Embodiment

Figure 2:
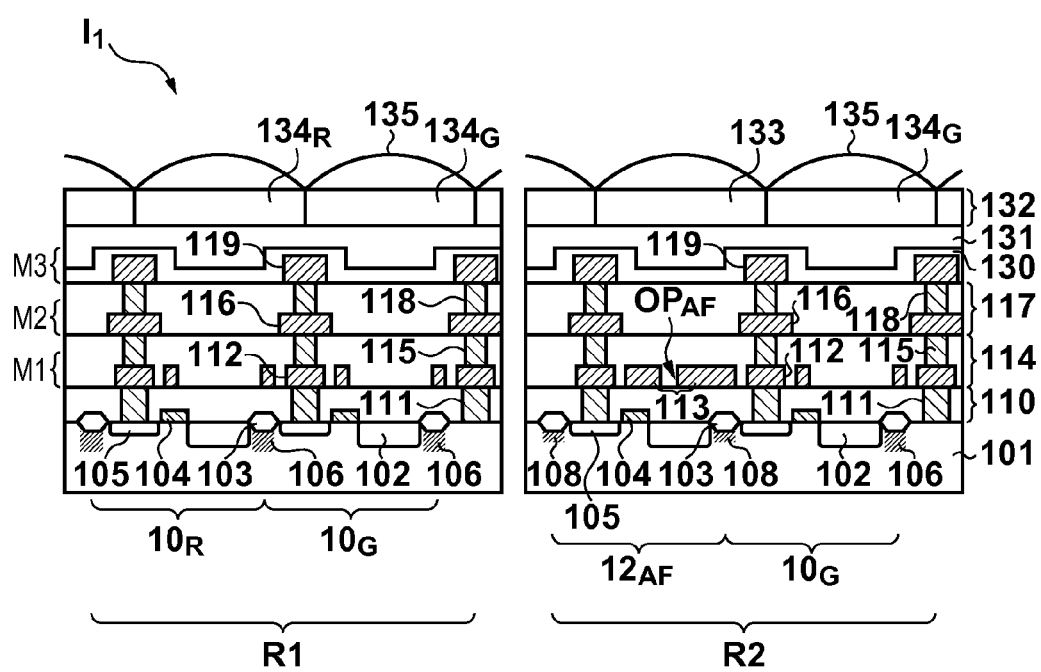
FIG. 2 is a view for explaining an example of the arrangement of a solid-state imaging apparatus according to the first embodiment.

A solid-state imaging apparatus $I_1$ of the first embodiment will be explained with reference to FIGS. 2, 3A, and 3B. FIG. 2 shows the sectional structure of the solid-state imaging apparatus $I_1$ like that in FIG. 1B. In the solid-state imaging apparatus $I_1$, an element isolation region 108 (a first region) shallower than an element isolation region 106 (a second region) between a red pixel $10_R$ and green pixel $10_G$ is formed between an AF pixel $12_{AF}$ and the green pixel $10_G$ on a substrate 101. The element isolation region 108 is shallower than the element isolation region 106, and hence has the ability to prevent the movement of an electric charge (for example, a movement by diffusion), which is lower than that of the element isolation region 106.

Figure 3A:
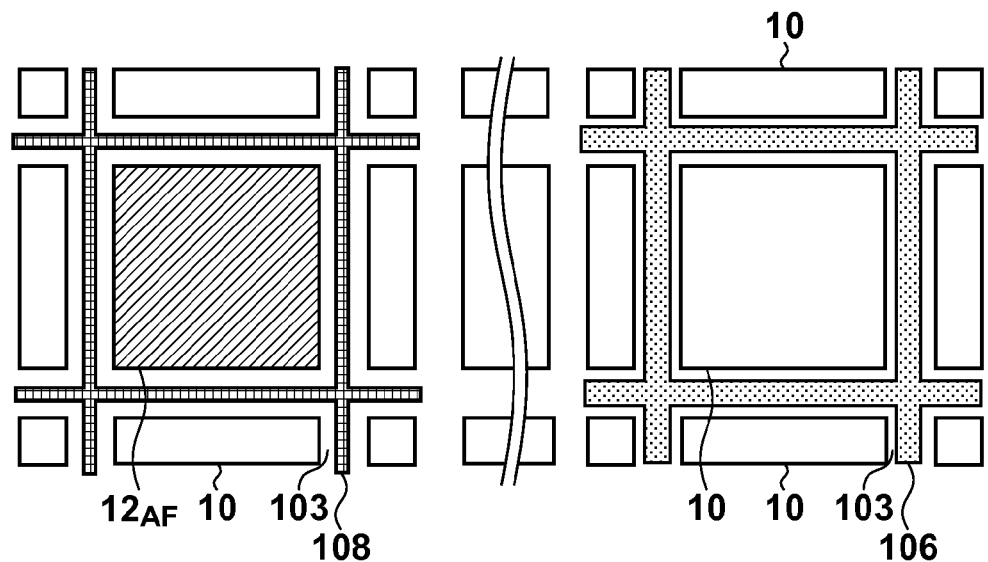
FIGS. 3A and 3B are plan views for explaining an example of the arrangement of the solid-state imaging apparatus according to the first embodiment.
Figure 3B:
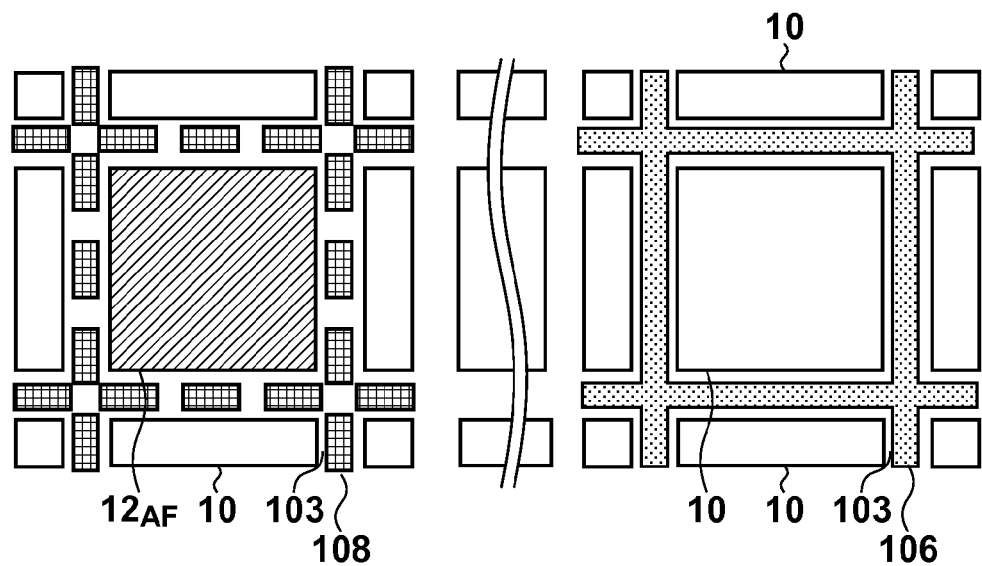

FIG. 3A exemplarily shows an example of the layout arrangement of the element isolation regions 106 and 108 of a pixel 10 for imaging and the AF pixel $12_{AF}$ of the solid-state imaging apparatus $I_1$ when viewed from above. As exemplified in FIG. 3A, the width of the element isolation region 108 is smaller than that of the element isolation region 106.

In this structure, the element isolation region 108 is formed to be shallower than the element isolation region 106. This makes it possible to decrease the difference between the crosstalk amount between the AF pixel $12_{AF}$ and green pixel $10_G$ and that between the red pixel $10_R$ and green pixel $10_G$. That is, it is possible to uniformize the difference between the amount of electric charge moving to the green pixel $10_G$ adjacent to the AF pixel $12_{AF}$ and the amount of electric charge moving to the green pixel $10_G$ adjacent to the red pixel $10_R$.

In the solid-state imaging apparatus $I_1$, therefore, in an arrangement in which the pixels 10 for imaging and the AF pixel $12_{AF}$ are arranged on the single substrate 101, uniformization is performed to decrease the difference between the crosstalk amount in the region where the AF pixel $12_{AF}$ is arranged and that in other regions. This can improve the quality of an image to be obtained.

In this embodiment, the structure in which the element isolation region 108 is shallower than the element isolation region 106 is taken as an example of the structure in which the charge movement preventing ability of the element isolation region 108 is lower than that of the element isolation region 106. However, the element isolation region 108 need only be formed to have a charge movement preventing ability lower than that of the element isolation region 106, so the present invention is not limited to the above-described structure. For example, it is possible to use a structure in which the width (the width between pixels to be isolated) of the element isolation region 108 is smaller than that of the element isolation region 106, or a structure in which the impurity concentration in the element isolation region 108 is lower than that in the element isolation region 106. Furthermore, for example, as exemplified in FIG. 3B, the element isolation region 108 may be formed by arranging diffusion regions with the same width as that of the element isolation region 106 at predetermined intervals. It is also possible to use a structure obtained by combining these structures.

Note that "the ability to prevent the movement of an electric charge is high" means that a barrier against a signal charge is low. The "barrier" herein mentioned is, for example, a potential barrier. Furthermore, the potential barrier is not limited to that formed by the element isolation regions 106 and 108 and it is also possible to form a low potential barrier by changing (decreasing) the structure (depth or width) of the isolation portion 103.

A method of manufacturing the solid-state imaging apparatus $I_1$ will be described below with reference to FIGS. 4A to 4D. FIGS. 4A to 4D each illustrate a region R2. First, as shown in FIG. 4A, a substrate 101 having a semiconductor region such as p-type silicon is prepared, and an isolation portion 103 can be formed on the surface of the substrate 101 by, for example, LOCOS.

Then, a photoresist pattern is formed on the substrate 101, and a p-type impurity can be implanted below the isolation portion 103 by, for example, ion implantation, thereby forming element isolation regions 106 and 108. The element isolation regions 106 and 108 having different depths may be formed by, for example, performing impurity implantation after a photoresist pattern having two kinds of openings different in film thickness of a residual film is formed. It is also possible to form the element isolation regions 106 and 108 by separately performing corresponding photoresist pattern formation and impurity implantation in order. Furthermore, after impurity implantation for forming the element isolation region 108 is performed in portions to be formed into the element isolation regions 106 and 108, additional impurity implantation may be performed in a portion to be formed into the element isolation region 106. When forming the above-described structure in which the width of the element isolation region 108 is small, it is only necessary to adjust, for example, the width of the opening in the photoresist pattern. When forming the structure in which the impurity concentration in the element isolation region 108 is low, it is only necessary to adjust, for example, the impurity implantation amount.

After that, the gate electrodes (in this example, a gate electrode 104) of various transistors (for example, a transfer transistor and source follower transistor) and n-type diffusion regions (in this example, a photoelectric conversion portion 102 and FD 105) can be formed by using a well-known semiconductor process. Although not shown in FIG. 4A, a gate insulating film of each transistor and a natural oxide film can be formed on the surface of the substrate 101.

Subsequently, a first interlayer insulation film 110 made of silicon oxide or an insulating material mainly containing silicon oxide is formed by, for example, CVD (Chemical Vapor Deposition) on the substrate 101 so as to cover the gate electrode 104 and the like. After that, the upper surface of the interlayer insulation film 110 is planarized by, for example, CMP (Chemical Mechanical Polishing). Then, a contact plug 111 for connecting a wiring pattern 112 to be formed in a first wiring layer M1 to the substrate 101, the gate electrode, and the like is formed. Then, an element such as Al, Mo, W, Ta, Ti, TiN, or Cu, a metal film mainly containing any of these elements, or a multilayered film of any of these elements is formed on the interlayer insulation film 110 by, for example, sputtering, CVD, or electroplating. After that, a wiring pattern 112 and light-shielding pattern 113 are formed in the first wiring layer M1 through a lithography step and etching step. Then, a second interlayer insulation film 114 is formed on the first wiring layer M1 so as to cover the wiring pattern 112 and light-shielding pattern 113, following the same procedures as for the interlayer insulation film 110. The upper surface of the second interlayer insulation film 114 can be planarized by CMP or the like. After that, an opening $115a$ for a contact plug 115 for connecting the wiring pattern 112 of the first wiring layer M1 to a wiring pattern 116 included in a second wiring layer M2 to be formed later can be formed.

Then, as shown in FIG. 4B, an element such as Al, Mo, W, Ta, Ti, TiN, or Cu or a metal member mainly containing any of these elements can be formed in the opening $115a$ by, for example, sputtering, CVD, or electroplating. In addition, this metal member is planarized by CMP, etch back, or the like, thereby forming a contact plug 115. Then, a wiring pattern 116 is formed in the second wiring layer M2 following the same procedures as for the wiring pattern 112 and light-shielding pattern 113. Furthermore, following the same procedures as for the interlayer insulation film 114, a third interlayer insulation layer 117 is formed on the second wiring layer M2 so as to cover the wiring pattern 116, and the upper surface of the third interlayer insulation layer 117 is planarized by CMP or the like. After that, following the same procedures as for the contact plug 115, an opening $118a$ for a contact plug 118 for connecting the wiring pattern 116 of the second wiring layer M2 to a wiring pattern 119 to be formed in a third wiring layer M3 is formed.

Subsequently, as shown in FIG. 4C, following the same procedures as for the opening $115a$ and contact plug 115, an opening $118a$ is formed in the interlayer insulation layer 117, and a contact plug 118 is formed after that. In addition, a wiring pattern 119 can be formed in the third wiring layer M3 following the same procedures as for the wiring pattern 116. After that, a passivation film 130 made of an inorganic material is formed on the interlayer insulation film 117 so as to cover the wiring pattern 119.

Then, as shown in FIG. 4D, a planarization layer 131 made of an organic material can be formed on the passivation film 130 by, for example, a coating method. After that, a filter layer 132 is formed on the planarization layer 131, and a color filter 134 or light-transmitting colorless member 133 is formed for each pixel 10 for imaging or each AF pixel $12_{AF}$. Finally, microlenses 135 are formed on a planarization layer (not shown) formed on the filter layer 132 in one-to-one correspondence with the pixels 10 for imaging and the AF pixels $12_{AF}$ through a predetermined patterning/reflow process. The colorless member 133 may also be a member integrated with the planarization layer formed on the filter layer 132.

By the manufacturing method described above, the solid-state imaging apparatus $I_1$ advantageous in improving the quality of an image to be obtained from the arrangement in which the pixels 10 for imaging and the AF pixel $12_{AF}$ are arranged on the single substrate 101 is obtained.

Second Embodiment

Figure 5:
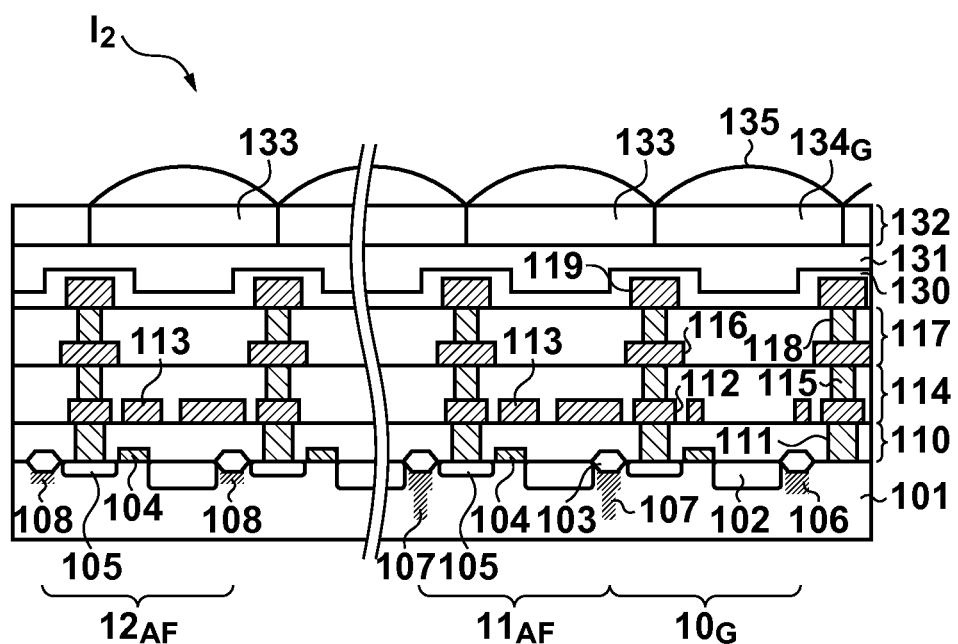
FIG. 5 is a view for explaining an example of the arrangement of a solid-state imaging apparatus according to the second embodiment.
Figure 6:
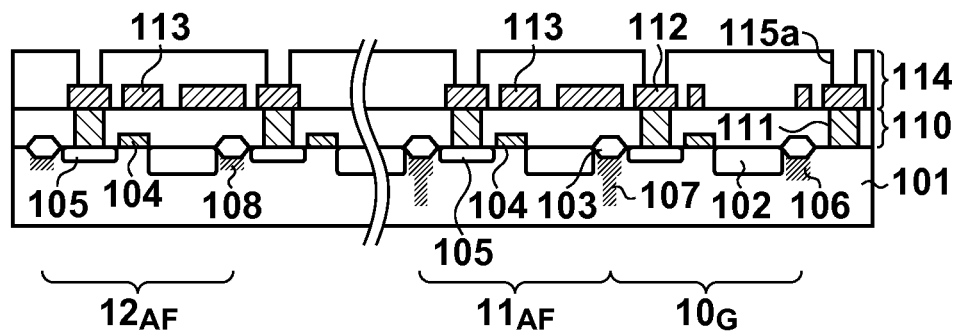
FIG. 6 is a view for explaining an example of a method of manufacturing the solid-state imaging apparatus according to the second embodiment.

A solid-state imaging apparatus $I_2$ of the second embodiment will be explained with reference to FIGS. 5 and 6. This embodiment differs from the first embodiment in that second pixels $11_{AF}$ for focus detection are arranged, in addition to AF pixels $12_{AF}$, in some of positions where blue pixels $10_B$ are to be arranged. FIG. 5 exemplarily shows the sectional structure of the solid-state imaging apparatus $I_2$. Note that the AF pixel $11_{AF}$ takes, for example, a structure in which a light-shielding pattern 113 having an opening $OP_{AF}$ is arranged in a wiring layer M1, similarly to the AF pixel $12_{AF}$.

A depth to which light reaches from the surface of a substrate 101 changes in accordance with the wavelength of the light. Therefore, light having entered a photoelectric conversion portion 102 of the AF pixel $11_{AF}$ causes photoelectric conversion in a position deeper from the surface of the substrate 101 than blue light having entered a photoelectric conversion portion 102 of the blue pixel $10_B$, thereby generating an electric charge. Consequently, the amount of crosstalk between the blue pixel $10_B$ and a green pixel $10_G$ may be different from that of crosstalk between the AF pixel $11_{AF}$ and the green pixel $10_G$. That is, the amount of electric charge moving to the green pixel $10_G$ adjacent to the AF pixel $11_{AF}$ becomes larger than that of electric charge moving to the green pixel $10_G$ adjacent to the blue pixel $10_B$, resulting in a difference in amount of crosstalk between regions R1 and R2.

In the solid-state imaging apparatus $I_2$, therefore, an element isolation region 107 to be formed between the AF pixel $11_{AF}$ and its adjacent pixel 10 is so formed as to make a charge movement preventing ability higher than that of an element isolation region 106 described in the first embodiment. As shown in FIG. 6 (corresponding to FIG. 4A), for example, the element isolation region 107 can be formed to be deeper than the element isolation region 106. That is, the element isolation region 106, the element isolation region 107, and an element isolation region 108 can be formed such that the depth from the surface of the substrate 101 increases in the order of the element isolation regions 107, 106, and 108.

As another arrangement of the element isolation region 107, for example, it is possible to take a structure in which the width (the width between pixels to be isolated) of the element isolation region 107 is larger than that of the element isolation region 106, or a structure in which the impurity concentration in the element isolation region 108 is higher than that in the element isolation region 106. It is also possible to take a structure obtained by combining these structures.

After that, following the same procedures as in the first embodiment, it is possible to sequentially form an interlayer insulation layer 110 or the like, contact plugs 111 or the like, light-shielding patterns 113, wiring patterns 112 or the like, a passivation film 130, a filter layer 132, and microlenses 135.

In this structure, the difference between the amount of crosstalk between the AF pixel $11_{AF}$ and green pixel $10_G$ and that of crosstalk between the blue pixel $10_B$ and green pixel $10_G$ can be uniformized, in addition to the effects described in the first embodiment. That is, the difference between the amount of electric charge moving to the green pixel $10_G$ adjacent to the AF pixel $11_{AF}$ and that of electric charge moving to the green pixel $10_G$ adjacent to the blue pixel $10_B$ can be uniformized.

In the solid-state imaging apparatus $I_2$, therefore, in the arrangement in which the second AF pixels $11_{AF}$ are additionally arrayed on the substrate 101, it is possible to decrease the difference between the amount of crosstalk in the region where the AF pixel $11_{AF}$ is arranged and that of crosstalk in other regions. This can improve the quality of an image to be obtained.

Although the two embodiments have been described above, the present invention is not limited to them, and can be changed in accordance with the purpose, state, application, function, and other specifications, that is, can be carried out by another embodiment. For example, in each of the above-described embodiments, the plurality of pixels are arranged in accordance with a Bayer array. However, the present invention is not limited to this arrangement, and the plurality of pixels can take another arrangement such as a honeycomb array. Furthermore, for example, a color solid-state imaging apparatus has been exemplified in each of the above-described embodiments. The present invention, however, is also applicable to a monochromatic solid-state imaging apparatus within the scope of the present invention.

(Imaging System)

In each of the above embodiments, the solid-state imaging apparatus included in an imaging system such as a camera has been described. The concept of the imaging system includes not only an apparatus whose main purpose is imaging, but also an apparatus (for example, a personal computer or portable terminal) having an imaging function as an auxiliary function. The imaging system can include the solid-state imaging apparatus according to the present invention exemplified as the above-mentioned embodiments, and a processing unit that processes an output signal from the solid-state imaging apparatus. This processing unit may perform signal processing for focus detection. Also, the processing unit can include an A/D converter, and a processor that processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-059061, filed Mar. 21, 2013, which is hereby incorporated by reference herein in its entirety.

What is claimed is:
1. A solid-state imaging apparatus, comprising:
a plurality of pixels arrayed on a substrate and each including a photoelectric conversion portion; and
element isolation regions formed between the plurality of pixels on the substrate,
wherein the plurality of pixels include
a first pixel including a first color filter for passing light having a first wavelength,
a second pixel including a second color filter for passing light having a second wavelength longer than the first wavelength, and a pixel for focus detection including a light-shielding pattern arranged on the photoelectric conversion portion to limit light entering the photoelectric conversion portion, and among the element isolation regions, a first region between the pixel for focus detection and the first pixel has a potential barrier against a signal charge, which is lower than that of a second region between the first pixel and the second pixel.

2. The apparatus according to claim 1, wherein at least one of following conditions is met:
the first region has a width between pixels, which is smaller than that of the second region;
the first region is shallower than the second region from the substrate; and
the first region has an impurity concentration lower than that of the second region.

3. The apparatus according to claim 1, wherein
the plurality of pixels further include a third pixel including a third color filter for passing light having a third wavelength shorter than the first wavelength,
the first pixel is arranged in a position corresponding to a green pixel in a Bayer array,
the pixel for focus detection or the second pixel is arranged in a position corresponding to a red pixel in the Bayer array, and
the third pixel is arranged in a position corresponding to a blue pixel in the Bayer array.

4. The apparatus according to claim 1, wherein
the plurality of pixels further include a plurality of wiring layers, and
a light-shielding pattern is arranged in a wiring layer closest to the substrate among the plurality of wiring layers.

5. The apparatus according to claim 1, wherein an isolation portion made of an insulator is formed on the element isolation region.

6. An imaging system comprising:
a solid-state imaging apparatus cited in claim 1; and
a processing unit configured to process an output signal from the solid-state imaging apparatus.

7. A solid-state imaging apparatus, comprising:
a plurality of pixels arrayed on a substrate and each including a photoelectric conversion portion; and
element isolation regions formed between the plurality of pixels on the substrate,
wherein the plurality of pixels include pixels for imaging and pixels for focus detection,
a light-shielding pattern for limiting light entering the photoelectric conversion portion is arranged on the pixel for focus detection, and
among the element isolation regions, a first region between the pixel for focus detection and the pixel for imaging has a potential barrier against a signal charge, which is lower than that of a second region between the two adjacent pixels for imaging.

8. The apparatus according to claim 7, wherein at least one of following conditions is met:
the first region has a width between pixels, which is smaller than that of the second region;
the first region is shallower than the second region from the substrate; and
the first region has an impurity concentration lower than that of the second region.

* * * * *